United States Patent
Lee et al.

(10) Patent No.: US 10,121,404 B2
(45) Date of Patent: Nov. 6, 2018

(54) DATA DRIVER AND DISPLAY APPARATUS INCLUDING THE SAME

(71) Applicant: Samsung Display Co., Ltd., Yongin-Si, Gyeonggi-Do (KR)

(72) Inventors: Whee-Won Lee, Busan (KR); Ga-Na Kim, Icheon-si (KR); Jung-Hwan Cho, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 238 days.

(21) Appl. No.: 15/099,002

(22) Filed: Apr. 14, 2016

(65) Prior Publication Data

US 2017/0092179 A1 Mar. 30, 2017

(30) Foreign Application Priority Data

Sep. 25, 2015 (KR) .................. 10-2015-0136734

(51) Int. Cl.
*G09G 3/36* (2006.01)
*G09G 3/20* (2006.01)
*H03K 19/21* (2006.01)

(52) U.S. Cl.
CPC .......... *G09G 3/2048* (2013.01); *H03K 19/21* (2013.01); *G09G 2310/08* (2013.01); *G09G 2370/025* (2013.01); *G09G 2370/08* (2013.01); *G09G 2370/16* (2013.01)

(58) Field of Classification Search
CPC ......... G09G 3/36; G11C 19/00; G02F 1/1345; G06K 9/46; G06K 9/64; G06K 9/20; G06K 9/32
See application file for complete search history.

(56) References Cited

U.S. PATENT DOCUMENTS

| | | | | |
|---|---|---|---|---|
| 5,495,346 A | * | 2/1996 | Choi | H04N 1/405 326/104 |
| 2008/0309602 A1 | * | 12/2008 | Hwang | G09G 3/006 345/89 |
| 2010/0277490 A1 | * | 11/2010 | Nam | G06F 3/147 345/581 |
| 2011/0248982 A1 | * | 10/2011 | Chuang | G09G 3/3685 345/212 |
| 2012/0176172 A1 | * | 7/2012 | Webb, III | G06F 1/0321 327/164 |
| 2013/0057520 A1 | * | 3/2013 | Hsiao | G09G 3/20 345/204 |
| 2014/0340579 A1 | | 11/2014 | Choi et al. | |
| 2015/0221248 A1 | * | 8/2015 | Kim | G09G 3/2044 345/204 |
| 2015/0339994 A1 | * | 11/2015 | Verbeure | G09G 3/2044 345/214 |
| 2016/0019848 A1 | * | 1/2016 | Isono | G09G 3/3611 345/214 |

* cited by examiner

*Primary Examiner* — Pegeman Karimi
(74) *Attorney, Agent, or Firm* — Cantor Colburn LLP

(57) ABSTRACT

A data driver includes a receiver, a transition minimization coding ("TMC") decoder, a dithering adder and a voltage generator. The receiver receives a clock signal and first image data which is generating by removing a dithering from a dithered original image data and performing a TMC. The TMC decoder removes the TMC from the first image data to generate second image data. The dithering adder restores the removed dithering based on the clock signal and the second image data to generate third image data. The voltage generator generates a plurality of data voltages based on the third image data.

20 Claims, 9 Drawing Sheets

DATA DRIVER AND DISPLAY APPARATUS INCLUDING THE SAME

This application claims priority to Korean Patent Application No. 10-2015-0136734, filed on Sep. 25, 2015, and all the benefits accruing therefrom under 35 U.S.C. § 119, the content of which in its entirety is herein incorporated by reference.

BACKGROUND

1. Field

Exemplary embodiments relate to a display apparatus, and more particularly to a data driver for operating a display panel and a display apparatuses including the data driver.

2. Description of the Related Art

A liquid crystal display apparatus is one of the most widely used types of flat panel display ("FPD"). The FPD may include, but are not limited to, a liquid crystal display ("LCD"), a plasma display panel ("PDP") and an organic light emitting display ("OLED"), for example.

The display apparatus may be used in various electronic systems, such as a mobile phone, a smart phone, a tablet computer, a personal digital assistant ("PDA"), etc. The restricted frequency bands in the display apparatus have increased as the serviced frequency bands in the electronic system increases. Thus, various methods have been proposed to reduce wireless wide area network ("WWAN") noise in the display apparatus to improve display quality.

SUMMARY

Exemplary embodiments of the disclosure are provided to substantially obviate one or more problems due to limitations and disadvantages of the related art.

At least one exemplary embodiment of the present disclosure provides a data driver capable of performing a dithering and a transition minimization coding ("TMC") with a relatively simple structure.

Exemplary embodiment of the disclosure provides a display apparatus including the data driver capable of efficiently reducing the wireless wide area network ("WWAN") noise.

According to exemplary embodiments, a data driver includes a receiver, a transition minimization coding ("TMC") decoder, a dithering adder and a voltage generator. The receiver receives a clock signal and first image data, where the first image data is generated by removing a dithering from a dithered original image data and performing a TMC thereon. The TMC decoder removes the TMC from the first image data to generate second image data. The dithering adder restores the removed dithering based on the clock signal and the second image data to generate third image data. The voltage generator generates a plurality of data voltages based on the third image data.

In an exemplary embodiment, the clock signal and the first image data may be combined to form a clock embedded data signal. The receiver may receive the clock embedded data signal. The data driver may further include a clock recoverer. The clock recoverer may divide the clock embedded data signal into the clock signal and the first image data.

In an exemplary embodiment, the clock recoverer may include a clock detector and an image data detector. The clock detector may set a clock window based on a clock training signal and may detect the clock signal from the clock embedded data signal based on the clock window. The image data detector may delay the clock embedded data signal based on the clock signal to detect the first image data.

In an exemplary embodiment, the clock signal may include a first clock bit and a second clock bit. The first clock bit may have a logic level different from a logic level of the second clock bit.

In an exemplary embodiment, the clock detector may determine a transition edge between the first clock bit and the second clock bit based on the clock window to detect the clock signal.

In an exemplary embodiment, the dithering adder may convert n-bit first pixel data in the second image data into n-bit second pixel data in the third image data based on a first clock bit in the clock signal, where n is a natural number equal to or greater than two.

In an exemplary embodiment, the dithering adder may include n XOR gates and (n−1) AND gates. A first XOR gate of the n XOR gates may perform an XOR operation on the first clock bit and a first bit of the first pixel data to generate a first bit of the second pixel data. A first AND gate of the (n−1) AND gates may perform an AND operation on the first clock bit and the first bit of the first pixel data. A second XOR gate m of the n XOR gates ay perform the XOR operation on an output of the first AND gate and a second bit of the first pixel data to generate a second bit of the second pixel data.

In an exemplary embodiment, when the first clock bit has a first logic level, the first pixel data may be substantially the same as the second pixel data. When the first clock bit has a second logic level, the first pixel data may be different from the second pixel data.

In an exemplary embodiment, a scrambling may be performed on the first image data. The data driver may further include a linear feedback shift register ("LFSR") and a descrambler. The LFSR may generate a random number. The descrambler may remove the scrambling from the first image data based on the random number.

In an exemplary embodiment, the voltage generator may include a latch, a digital-to-analog converter and a buffer. The latch may store the third image data. The digital-to-analog converter may convert the third image data into the plurality of data voltages. The buffer may output the plurality of data voltages.

According to exemplary embodiments, a display apparatus includes a timing controller, a data driver and a display panel. The timing controller receives first input image data, which is generated by performing a dithering on original image data, and outputs a clock signal and first image data, where the timing controller generates the first image data by removing the dithering from the first input image data and by performing a TMC on the first input image data. The data driver receives the clock signal and the first image data, where the data driver removes the TMC from the first image data, restores the removed dithering based on the clock signal, and generates a plurality of data voltages based on image data generated by removing the TMC and restoring the dithering. The display panel displays an image based on the plurality of data voltages.

In an exemplary embodiment, the timing controller may include a receiver, a dithering inverter, a TMC encoder and a transmitter. The receiver may receive the first input image data. The dithering inverter may remove the dithering from the first input image data based on a plurality of inversion dithering maps to generate second input image data. The TMC encoder may perform the TMC on the second input image data to generate the first image data. The transmitter may output the clock signal and the first image data.

In an exemplary embodiment, the timing controller may further include a LFSR and a scrambler. The LFSR may generate a random number. The scrambler may perform a scrambling on an output of the TMC encoder based on the random number.

In an exemplary embodiment, the data driver may include a receiver, a TMC decoder, a dithering adder and a voltage generator. The receiver may receive the clock signal and the first image data. The TMC decoder may remove the TMC from the first image data to generate second image data. The dithering adder may restore the dithering based on the clock signal and the second image data to generate third image data. The voltage generator may generate the plurality of data voltages based on the third image data.

In an exemplary embodiment, the clock signal and the first image data may be combined to form a clock embedded data signal. The receiver may receive the clock embedded data signal. The data driver may further include a clock recoverer. The clock recoverer may divide the clock embedded data signal into the clock signal and the first image data.

In an exemplary embodiment, the clock recoverer may include a clock detector and an image data detector. The clock detector may set a clock window based on a clock training signal and may detect the clock signal from the clock embedded data signal based on the clock window. The image data detector may delay the clock embedded data signal based on the clock signal to detect the first image data.

In an exemplary embodiment, the clock signal may include a first clock bit and a second clock bit. The first clock bit may have a logic level different from a logic level of the second clock bit.

In an exemplary embodiment, the clock detector may determine a transition edge between the first clock bit and the second clock bit based on the clock window to detect the clock signal.

In an exemplary embodiment, the dithering adder may convert n-bit first pixel data in the second image data into n-bit second pixel data in the third image data based on a first clock bit in the clock signal, where n is a natural number equal to or greater than two.

In an exemplary embodiment, the dithering adder may include n XOR gates and (n−1) AND gates. A first XOR gate of the n XOR gates may perform an XOR operation on the first clock bit and a first bit of the first pixel data to generate a first bit of the second pixel data. A first AND gate of the (n−1) AND gates may perform an AND operation on the first clock bit and the first bit of the first pixel data. A second XOR gate of the n XOR gates may perform the XOR operation on an output of the first AND gate and a second bit of the first pixel data to generate a second bit of the second pixel data.

In such embodiments, the data driver may restore the dithering, which is removed by the timing controller, based on the dithering adder. Accordingly, the data driver may not include a storage that stores dithering maps, and may restore the dithering with a relatively simple structure.

According to exemplary embodiments of the display apparatus including the data driver, the timing controller may remove the dithering from image data, and may perform the TMC on the image data. The data driver may remove the TMC from image data received from the timing controller, and may restore the dithering on the image data. The display apparatus may perform the TMC on dithered data, and the dithered data may be internally transmitted without damage in the dithered data and/or degradation of an image. Accordingly, the WWAN noise may be efficiently reduced in the display apparatus.

BRIEF DESCRIPTION OF THE DRAWINGS

Illustrative, non-limiting exemplary embodiments will be more clearly understood from the following detailed description taken in conjunction with the accompanying drawings, in which:

FIGS. 3A and 3B are diagrams for describing an operation of the timing controller of FIG. 2;

DETAILED DESCRIPTION

Figure 1:
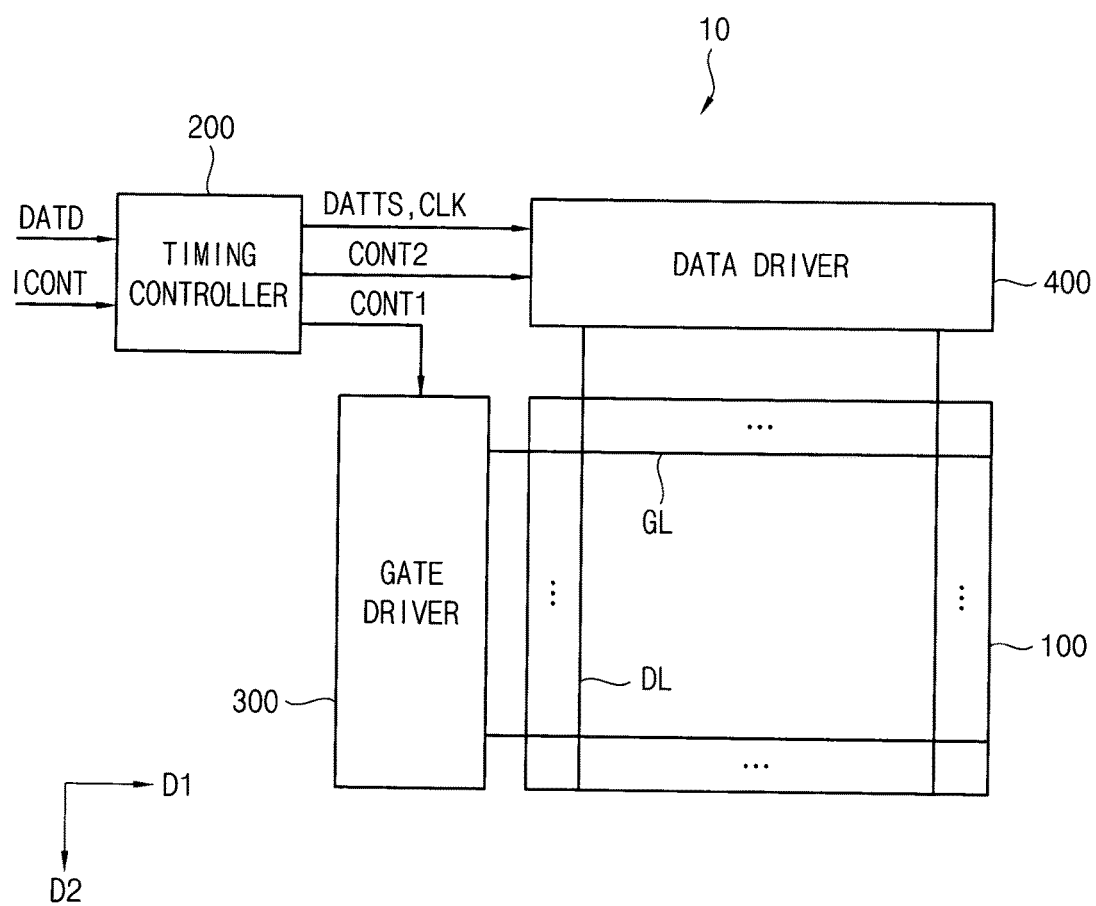
FIG. 1 is a block diagram illustrating a display apparatus according to exemplary embodiments.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be described in detail with reference to the accompanying drawings.

FIG. 1 is a block diagram illustrating a display apparatus according to exemplary embodiments.

Referring to FIG. 1, an exemplary embodiment of a display apparatus 10 includes a display panel 100, a timing controller 200, a gate driver 300 and a data driver 400.

The display panel 100 operates (e.g., display an image) based on first image data DATTS. The display panel 100 includes a plurality of gate lines GL and a plurality of data lines DL. The gate lines GL may extend in a first direction D1, and the data lines DL may extend in a second direction D2 crossing (e.g., substantially perpendicular to) the first direction D1. The display panel 100 may include a plurality of pixels (not illustrated) that are arranged in a matrix form. Each pixel may be electrically connected to a respective one of the gate lines GL and a respective one of the data lines DL.

The timing controller 200 controls an operation of the display panel 100 and controls operations of the gate driver 300 and the data driver 400. The timing controller 200 receives first input image data DATD and an input control signal ICONT from an external device (e.g., a host or a graphic processor). The first input image data DATD may include a plurality of pixel data for the plurality of pixels. The input control signal ICONT may include a master clock signal, a data enable signal, a vertical synchronization signal and a horizontal synchronization signal, for example.

The timing controller 200 generates the first image data DATTS based on the first input image data DATD. The timing controller 200 generates a clock signal CLK based on the first input image data DATD and the input control signal ICONT. The timing controller 200 generates a first control signal CONT1 based on the input control signal ICONT. The first control signal CONT1 may be provided to the gate driver 300, and a driving timing of the gate driver 300 may be controlled based on the first control signal CONT1. The first control signal CONT1 may include a vertical start signal and a gate clock signal, for example. The timing controller 200 generates a second control signal CONT2 based on the input control signal ICONT. The second control signal CONT2 may be provided to the data driver 400, and a driving timing of the data driver 400 may be controlled based on the second control signal CONT2. The second control signal CONT2 may include a horizontal start signal, a data clock signal, a data load signal and a polarity control signal, for example.

The gate driver 300 generates a plurality of gate signals for driving the gate lines GL based on the first control signal CONT1. The gate driver 300 may sequentially apply the gate signals to the gate lines GL. In one exemplary embodiment, for example, the gate driver 300 may include a plurality of shift registers (not illustrated).

The data driver 400 generates a plurality of analog data voltages based on the second control signal CONT2 and the digital image data DATTS. The data driver 400 may sequentially apply the data voltages to the data lines DL.

In some exemplary embodiments, the gate driver 300 and/or the data driver 400 may be disposed, e.g., directly mounted, on the display panel 100, or may be connected to the display panel 100 in a tape carrier package ("TCP") type. Alternatively, the gate driver 300 and/or the data driver 400 may be integrated on the display panel 100.

In an exemplary embodiment of the display apparatus 10, a dithering may be applied to the first input image data DATD provided from the external device. In such embodiments, the external device may generate the first input image data DATD by performing the dithering on original image data. The timing controller 200 may generate the first image data DATTS by removing the dithering from the first input image data DATD and by performing a transition minimization coding ("TMC") on the first input image data DATD. The timing controller 200 may generate the clock signal CLK that represents whether grayscales are changed or not based on the dithering. The data driver 400 may generate the plurality of data voltages by removing the TMC from the first image data DATTS and by restoring the dithering based on the clock signal. Accordingly, the display apparatus 10 may efficiently perform both the dithering and the TMC, and the wireless wide area network ("WWAN") noise in the display apparatus 10 may be reduced.

Figure 2:
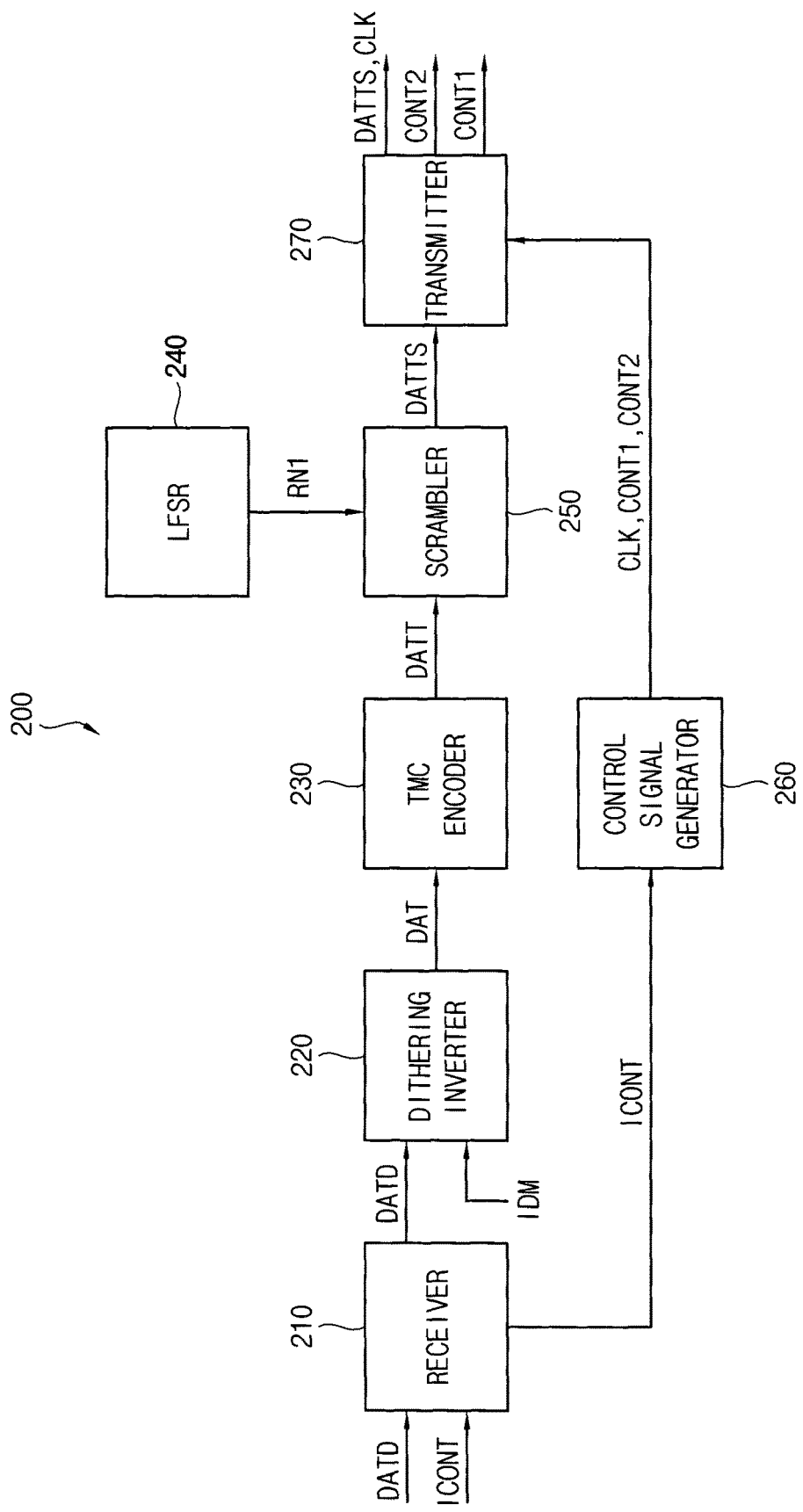
FIG. 2 is a block diagram illustrating a timing controller included in the display apparatus according to exemplary embodiments.
Figures 3A, 3B:
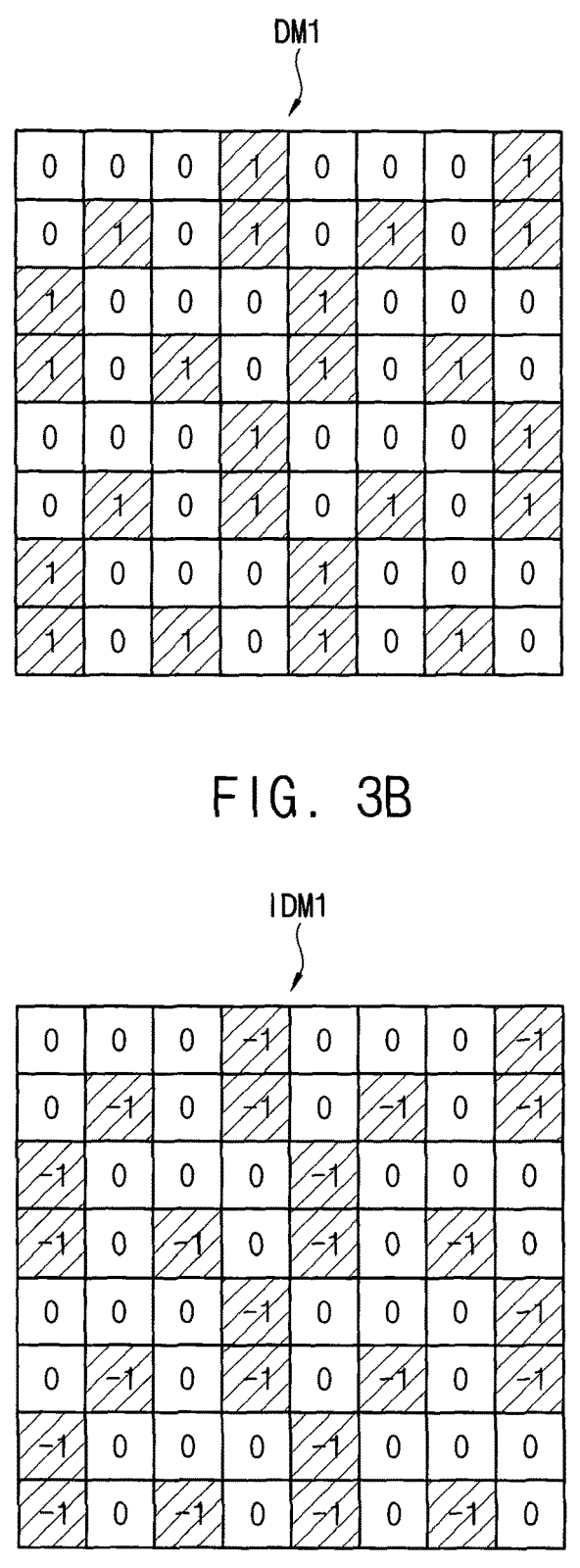

FIG. 2 is a block diagram illustrating a timing controller included in the display apparatus according to exemplary embodiments. FIGS. 3A and 3B are diagrams for describing an operation of the timing controller of FIG. 2.

Referring to FIGS. 1 and 2, an exemplary embodiment of a timing controller 200 may include a receiver 210, a dithering inverter 220, a TMC encoder 230 and a transmitter 270. The timing controller 200 may further include a linear feedback shift register ("LFSR") 240, a scrambler 250 and a control signal generator 260.

The receiver 210 may receive the first input image data DATD and the input control signal ICONT from the external device. The first input image data DATD may be provided to the dithering inverter 220, and the input control signal ICONT may be provided to the control signal generator 260.

In some exemplary embodiments, the timing controller 200 may communicate with the external device based on an extreme discovery protocol ("eDP"). In such embodiments, the first input image data DATD and the input control signal ICONT may be transmitted from the external device to the timing controller 200 based on the eDP, and the receiver 210 may be an eDP receiver.

The dithering inverter 220 may remove the dithering from the first input image data DATD based on a plurality of inversion dithering maps IDM to generate second input image data DAT. In one exemplary embodiment, for example, a plurality of frame images may be displayed on the display panel 100 based on the first input image data DATD, and the dithering inverter 220 may remove the dithering from each of the plurality of frame images based on a respective one of the plurality of inversion dithering maps IDM.

In some exemplary embodiments, the plurality of inversion dithering maps IDM may be stored in a storage (not illustrated) included in the timing controller 200, or may be stored in the dithering inverter 220. Alternatively, although not illustrated in FIGS. 1 and 2, the plurality of inversion dithering maps IDM may be provided with the first input image data DATD from the external device.

The dithering may be used in computer graphics to create the illusion of color depth in images with a limited color palette. In a dithered image, colors that are not available in the palette are approximated by a diffusion of colored pixels from within the available palette. The human eye perceives the diffusion as a mixture of the colors therein. Assuming that the display panel 100 displays two-hundred-fifty-six grayscales, which range from about zero (0) grayscale to about 255 grayscale, about 21.5 grayscale may be displayed on the display panel 100 by combining at least two adjacent pixels. When two adjacent pixels display 21 grayscale and 22 grayscale, respectively, and about 21.5 grayscale may be displayed by the two adjacent pixels.

Referring to FIGS. 3A and 3B, in some exemplary embodiments, the external device may perform the dithering on a first frame image among the plurality of frame images based on a first dithering map DM1. In one exemplary embodiment, for example, the dithering may be performed on the first frame image by maintaining first grayscales of the first frame image and by increasing second grayscales of the first frame image by about 1 grayscale. The first grayscales of the first frame image may correspond to regions "0" in the first dithering map DM1, and the second grayscales of the first frame image may correspond to regions "1" in the first dithering map DM1.

The dithering inverter 220 may remove the dithering from the dithered first frame image based on a first inversion dithering map IDM1 corresponding to the first dithering map DM1. In one exemplary embodiment, for example, the dithering may be removed from the dithered first frame image by maintaining first grayscales of the dithered first frame image and by decreasing second grayscales of the dithered first frame image by about 1 grayscale. The first grayscales of the dithered first frame image may correspond to regions "0" in the first inversion dithering map IDM1, and the second grayscales of the dithered first frame image may correspond to regions "−1" in the first inversion dithering map IDM1. In such an embodiment, original grayscales of the first frame image may be restored by removing the dithering.

In some exemplary embodiments, the first inversion dithering map IDM1 may have a configuration similar to that of the first dithering map DM1. In one exemplary embodiment, for example, an arrangement of the regions "0" in the first inversion dithering map IDM1 may be substantially the same as an arrangement of the regions "0" in the first dithering map DM1. An arrangement of the regions "−1" in the first inversion dithering map IDM1 may be substantially the same as an arrangement of the regions "1" in the first dithering map DM1.

Referring back to FIGS. 1 and 2, the TMC encoder 230 may perform the TMC on the second input image data DAT to generate third input image data DATT.

The TMC is a technology for transmitting high-speed serial data. In the TMC, the transmitted data may have a relatively small number of transitions and/or may be not transitioned. In one exemplary embodiment, for example, when first data of a first pixel and second data of a second pixel adjacent to the first pixel are substantially the same as each other, original first data for the first pixel may be transmitted to a receiver (e.g., the data driver 400), zero data for the second pixel may be transmitted to the receiver, and then original second data for the second pixel may be restored at the receiver based on the original first data and the zero data. Thus, the number of transitions in the transmitted data may be reduced based on the TMC.

In some exemplary embodiments, an XOR operation may be used to perform the TMC on data. In one exemplary embodiment, for example, as described above, when the first data of the first pixel and the second data of the second pixel are substantially the same as each other, the zero data may be generated by performing the XOR operation on the first data and the second data. In such embodiments, as will be described below with reference to FIG. 8, the XOR operation may be used to remove the TMC from transition minimization coded data.

The LFSR 240 may generate a first random number RN1. The scrambler 250 may perform a scrambling on an output of the TMC encoder 230 (e.g., the third input image data DATT) based on the first random number RN1 to generate the first image data DATTS. The scrambling is one of data encryptions for improving the data transmission performance. In the scrambling, an arrangement of original data may be randomly changed, dummy data may be inserted into original data, and/or a portion of original data may be substituted with another data.

In an alternative exemplary embodiment, the LFSR 240 and the scrambler 250 shown in FIG. 2 may be omitted in the timing controller 200. In such an embodiment, where the LFSR 240 and the scrambler 250 are omitted, the TMC encoder 230 may perform the TMC on the second input image data DAT to generate the first image data DATTS.

The control signal generator 260 may generate the clock signal CLK, the first control signal CONT1 and the second control signal CONT2 based on the input control signal CONT.

In some exemplary embodiments, the clock signal CLK may include a first clock bit that represents whether the grayscales are changed or not based on the dithering. In one exemplary embodiment, for example, the first clock bit may have a first logic level (e.g., a logic low level) for data corresponding to the regions "0" in the first dithering map DM1 of FIG. 3A and the regions "0" in the first inversion dithering map IDM1 of FIG. 3B. The first clock bit may have a second logic level (e.g., a logic high level) for data corresponding to the regions "1" in the first dithering map DM1 of FIG. 3A and the regions "−1" in the first inversion dithering map IDM1 of FIG. 3B. As will be described below with reference to FIGS. 4 and 8, the data driver 400 may restore the dithering, which is removed by the dithering inverter 220, based on the first clock bit of the clock signal CLK.

The transmitter 270 may output the clock signal CLK, the first image data DATTS, the first control signal CONT1 and the second control signal CONT2. The first control signal CONT1 may be provided to the gate driver 300. The clock signal CLK, the first image data DATTS and the second control signal CONT2 may be provided to the data driver 400.

In some exemplary embodiments, as will be described below with reference to FIG. 6, the clock signal CLK and the first image data DATTS may be combined to form a clock embedded data signal. The transmitter 270 may output the clock embedded data signal including the clock signal CLK and the first image data DATTS.

In some exemplary embodiments, the timing controller 200 may communicate with the data driver 400 based on a universal serial interface ("USI-GF"). In such embodiments, the clock signal CLK, the first image data DATTS and the second control signal CONT2 may be transmitted from the timing controller 200 to the data driver 400 based on the USI-GF, and the transmitter 270 may be an USI-GF transmitter. In some exemplary embodiments, the timing controller 200 may communicate with the gate driver 300 based on the USI-GF.

In an alternative exemplary embodiment, the timing controller 200 may further include an image processor (not shown) that selectively performs an image quality compensation, a spot compensation, an adaptive color correction ("ACC"), and/or a dynamic capacitance compensation ("DCC") on at least one of the input image data DATD, DAT, DATT.

Figure 4:
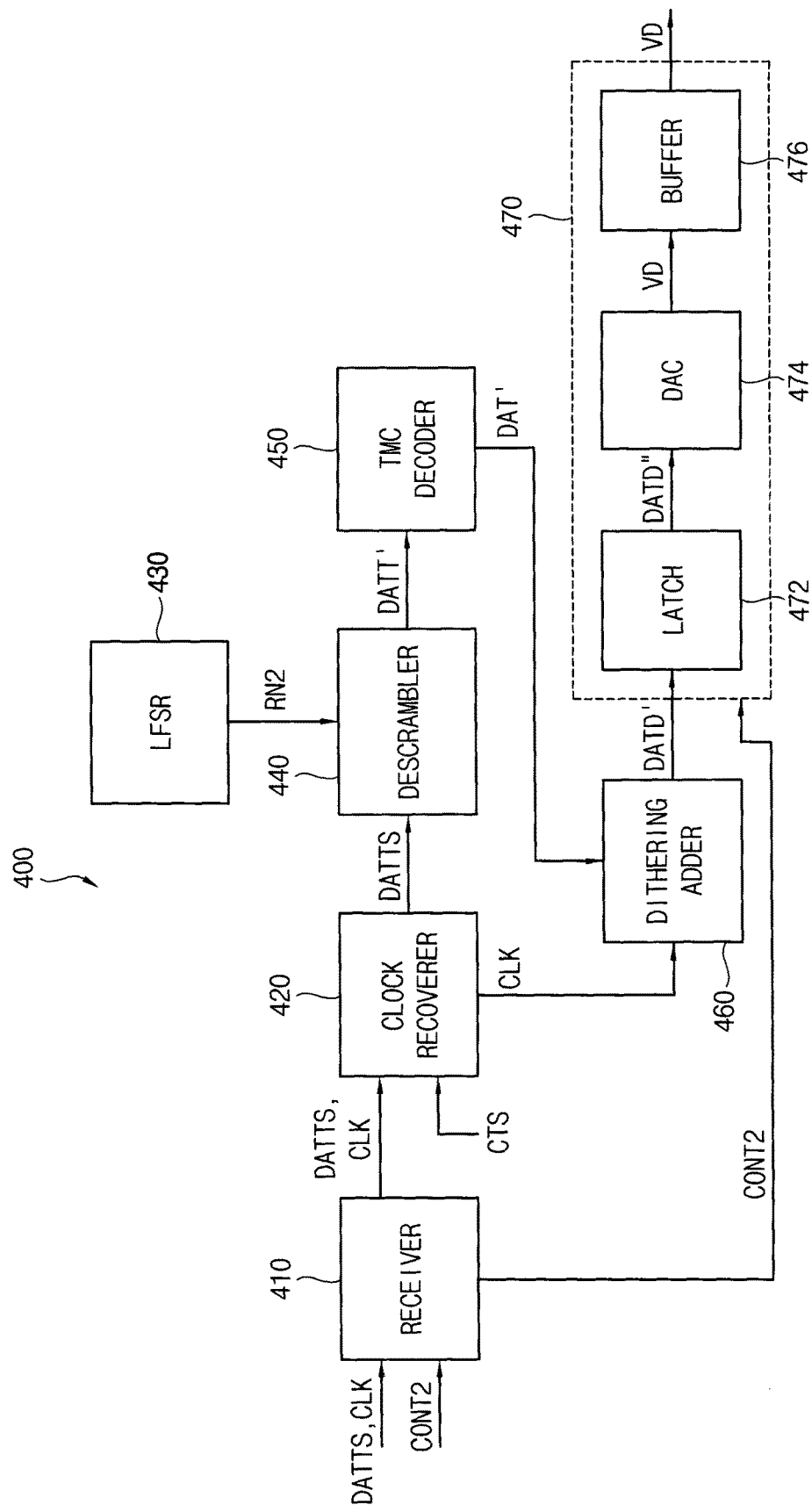
FIG. 4 is a block diagram illustrating a data driver included in the display apparatus according to exemplary embodiments.
Figure 5:
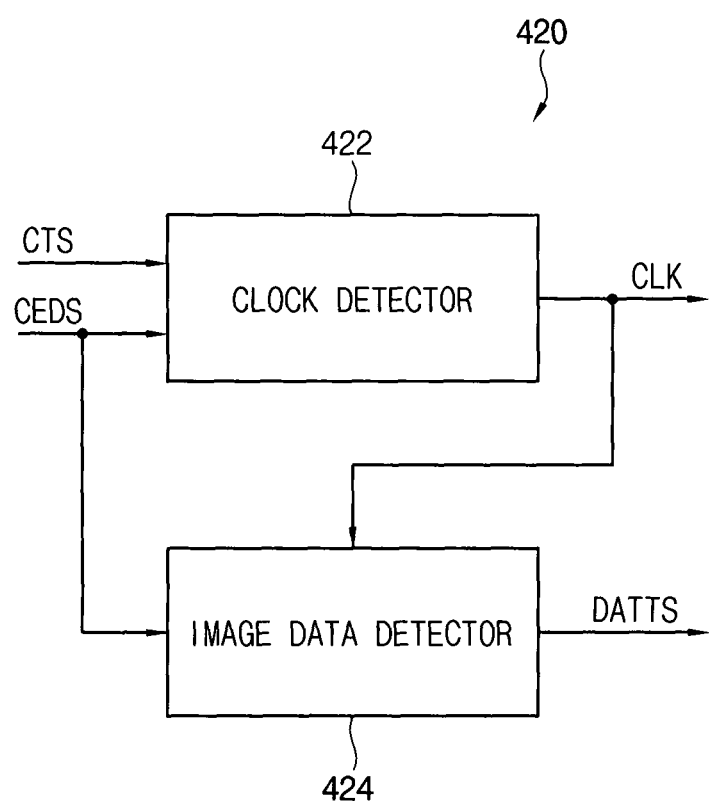
FIGS. 5, 6 and 7 are diagrams for describing an operation and a configuration of a clock recoverer included in the data driver of FIG. 4.

FIG. 4 is a block diagram illustrating a data driver included in the display apparatus according to exemplary embodiments. FIGS. 5, 6 and 7 are diagrams for describing an operation and a configuration of a clock recoverer included in the data driver of FIG. 4. FIG. 8 is a block diagram illustrating an exemplary embodiment of a dithering adder included in the data driver of FIG. 4.

Referring to FIGS. 1 and 4, an exemplary embodiment of a data driver 400 may include a receiver 410, a TMC decoder 450, a dithering adder 460 and a voltage generator 470. The data driver 400 may further include a clock recoverer 420, a LFSR 430 and a descrambler 440.

The receiver 410 may receive the clock signal CLK, the first image data DATTS and the second control signal CONT2 from the timing controller 200. The clock signal CLK and the first image data DATTS may be provided to the clock recoverer 420, and the second control signal CONT2 may be provided to the voltage generator 470.

In some exemplary embodiments, as described above with reference to FIG. 2, the data driver 400 may communicate with the timing controller 200 based on the USI-GF. In one exemplary embodiment, for example, the receiver 410 may be an USI-GF receiver.

In some exemplary embodiments, the clock signal CLK and the first image data DATTS may be combined to form the clock embedded data signal. In such embodiments, the receiver may receive a single clock embedded data signal including the clock signal CLK and the first image data DATTS. The clock recoverer 420 may divide the clock embedded data signal into the clock signal CLK and the first image data DATTS based on a clock training signal CTS.

Figure 6:
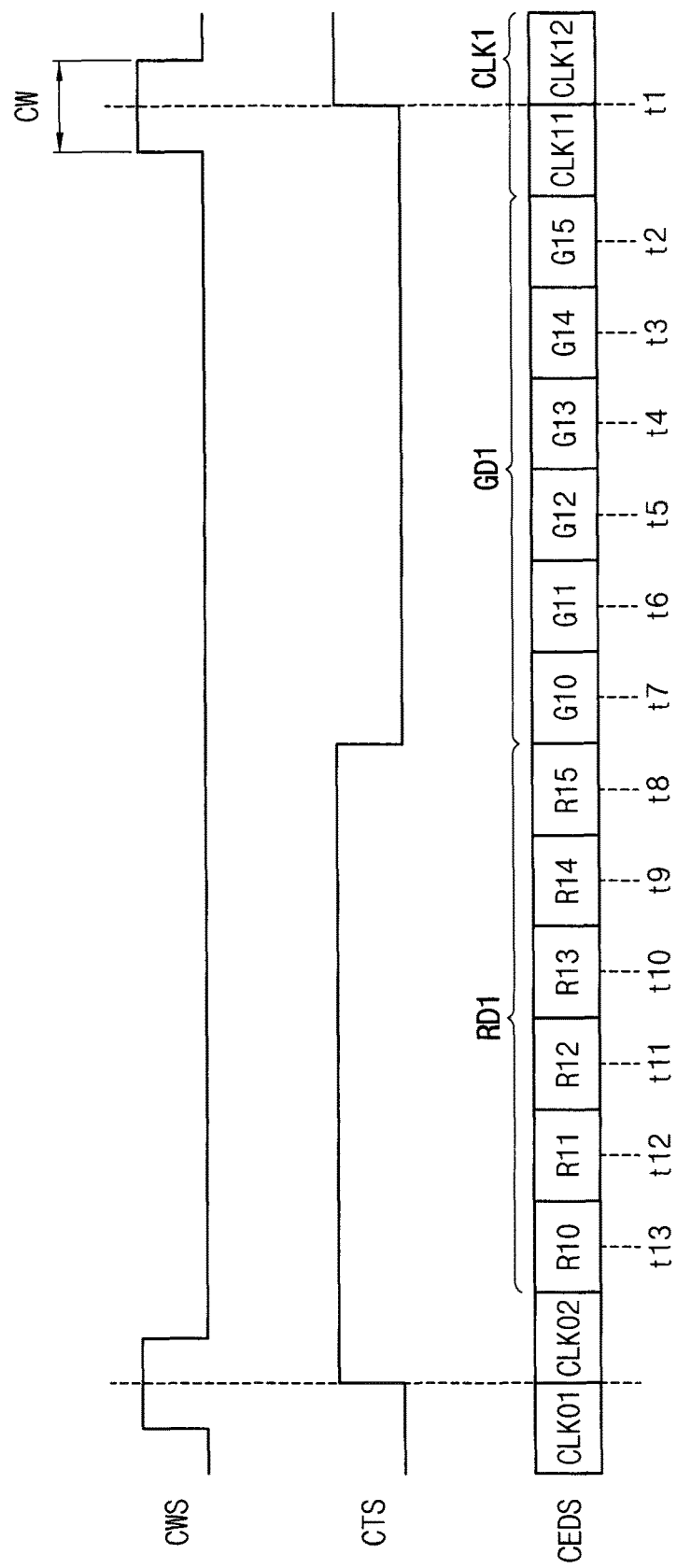
Figure 7:
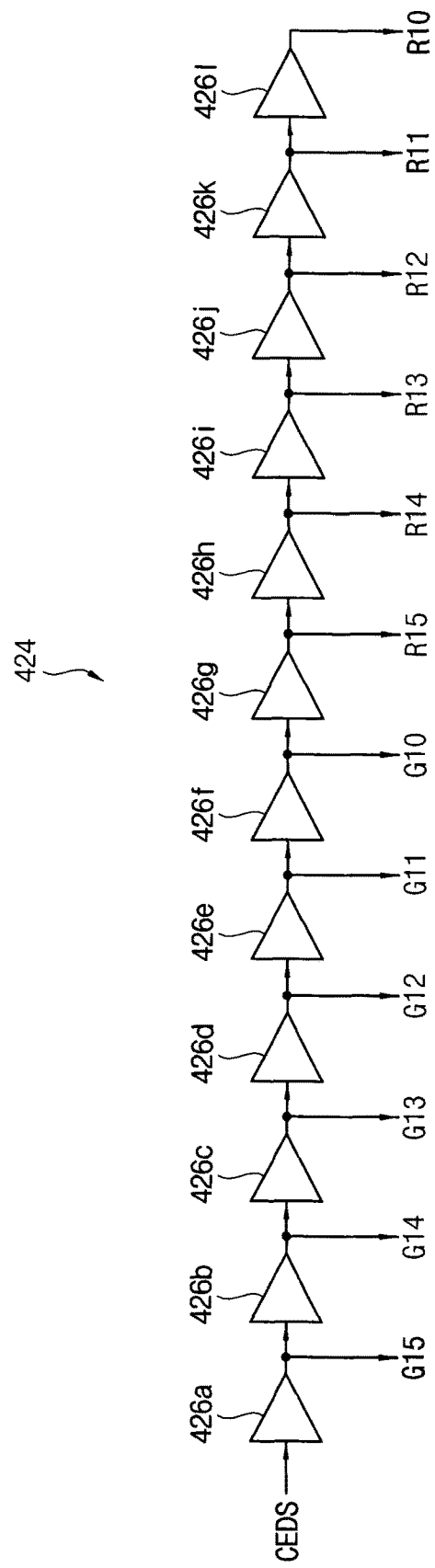
Figure 8:
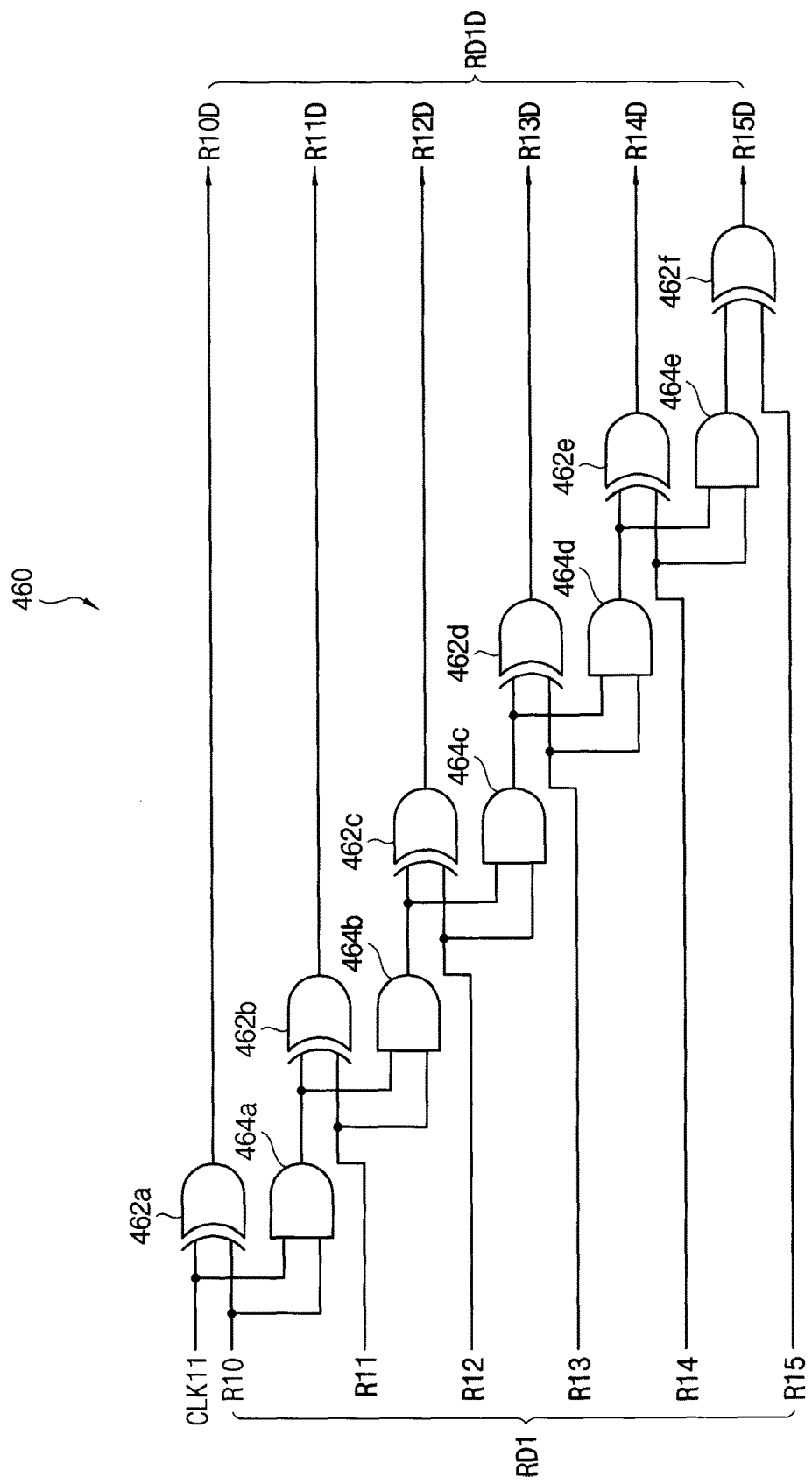
FIG. 8 is a block diagram illustrating an exemplary embodiment of a dithering adder included in the data driver of FIG. 4.

Referring to FIGS. 5, 6 and 7, in some exemplary embodiments, a clock recoverer 420 may include a clock detector 422 and an image data detector 424.

The clock detector 422 may receive the clock training signal CTS and a clock embedded data signal CEDS. The clock training signal CTS may be predetermined in an initial operation time, or may be determined based on a training operation. The clock detector 422 may set a clock window CW based on the clock training signal CTS.

In one exemplary embodiment, for example, as illustrated in FIG. 6, the clock embedded data signal CEDS may include the first image data DATTS and the clock signal CLK. The first image data DATTS may include first pixel data RD1 having bits R10, R11, R12, R13, R14 and R15, and second pixel data GD1 having bits G10, G11, G12, G13, G14 and G15. The clock signal CLK may include a first clock data CLK1 having bits CLK11 and CLK12, and a second clock data CLK2 having bits CLK01 and CLK02. The bits in the clock embedded data signal CEDS may be arranged based on a predetermined pattern. In one exemplary embodiment, for example, the predetermined pattern may represent repeated arrangements, each of which includes two 6-bit pixel data (e.g., RG1 and GD1) and one 2-bit clock data (e.g., CLK1). The clock training signal CTS may include a clock training high duration and a clock training low duration that correspond to the predetermined pattern. The clock detector 422 may set the clock window CW in a clock window signal CWS such that the clock window CW has a predetermined time interval with respect to an edge (e.g., a rising edge at time t1) of the clock training signal CTS.

The clock detector 422 may detect the clock signal CLK from the clock embedded data signal CEDS based on the clock window CW. In one exemplary embodiment, for example, as illustrated in FIG. 6, the clock signal CLK may include the first clock data CLK1 that includes a first clock bit CLK11 and a second clock bit CLK12. The clock detector 422 may determine a boundary between the first clock bit CLK11 and the second clock bit CLK12 based on the clock window CW to detect the first clock data CLK1 of the clock signal CLK.

In some exemplary embodiments, the first clock bit CLK11 may have a logic level different from that of the second clock bit CLK12. In one exemplary embodiment, for example, when the first clock bit CLK11 has the first logic level (e.g., the logic low level), the second clock bit CLK12 may have the second logic level (e.g., the logic high level). In such an embodiment, when the first clock bit CLK11 has the second logic level, the second clock bit CLK12 may have the first logic level. Thus, the first clock data CLK1 may always have a transition edge (e.g., one of a rising edge and a falling edge) between the first clock bit CLK11 and the second clock bit CLK12. The clock detector 422 may determine the transition edge between the first clock bit CLK11 and the second clock bit CLK12 based on the clock window CW to detect the first clock data CLK1 of the clock signal CLK The image data detector 424 may delay the clock embedded data signal CEDS based on the clock signal CLK (e.g., the first clock data CLK1) to detect the first image data DATTS. In one exemplary embodiment, for example, as illustrated in FIG. 7, the image data detector 424 may include a plurality of delay locked loops ("DLL"s), e.g., first to twelfth DLL 426a, 426b, 426c, 426d, 426e, 426f, 426g, 426h, 426i, 426j, 426k and 426l, that are cascaded connected.

The first DLL 426a may delay the clock embedded data signal CEDS at time t1, and may detect the sixth bit G15 of the second pixel data GD1 at time t2. The second DLL 426b may delay the clock embedded data signal CEDS at time t2 (e.g., may delay an output of the first DLL 426a), and may detect the fifth bit G14 of the second pixel data GD1 at time t3. The third DLL 426c may delay the clock embedded data signal CEDS at time t3 (e.g., may delay an output of the second DLL 426b), and may detect the fourth bit G13 of the second pixel data GD1 at time t4. The fourth DLL 426d may delay the clock embedded data signal CEDS at time t4 (e.g., may delay an output of the third DLL 426c), and may detect the third bit G12 of the second pixel data GD1 at time t5. The fifth DLL 426e may delay the clock embedded data signal CEDS at time t5 (e.g., may delay an output of the fourth DLL 426d), and may detect the second bit G11 of the second pixel data GD1 at time t6. The sixth DLL 426f may delay the clock embedded data signal CEDS at time t6 (e.g., may delay an output of the fifth DLL 426e), and may detect the first bit G10 of the second pixel data GD1 at time t7.

Similarly, the seventh DLL 426g may delay the clock embedded data signal CEDS at time t7 (e.g., may delay an output of the sixth DLL 426f), and may detect the sixth bit R15 of the first pixel data RD1 at time t8. The eighth DLL 426h may delay the clock embedded data signal CEDS at time t8 (e.g., may delay an output of the seventh DLL 426g), and may detect the fifth bit R14 of the first pixel data RD1 at time t9. The ninth DLL 426i may delay the clock embedded data signal CEDS at time t9 (e.g., may delay an output of the eighth DLL 426h), and may detect the fourth bit R13 of the first pixel data RD1 at time t10. The tenth DLL 426j may delay the clock embedded data signal CEDS at time t10 (e.g., may delay an output of the ninth DLL 426i), and may detect the third bit R12 of the first pixel data RD1 at time t11. The eleventh DLL 426k may delay the clock embedded data signal CEDS at time t11 (e.g., may delay an output of the tenth DLL 426j), and may detect the second bit R11 of the first pixel data RD1 at time t12. The twelfth DLL 426l may delay the clock embedded data signal CEDS at time t12 (e.g., may delay an output of the eleventh DLL 426k), and may detect the first bit R10 of the first pixel data RD1 at time t13.

In the image data detector 424, the delaying operation and the detecting operation for the first clock data CLK1 may be repeated until all bits R10 to R15 and G10 to G15 of the pixel data RD1 and GD1 associated with the first clock data CLK1 are detected (e.g., before at least one the bits CLK01 and CLK02 of the second clock data CLK2 is detected).

Although an operation and a configuration of the clock recoverer 420 is described based on an exemplary embodiment of the clock embedded data signal CEDS in FIG. 6, the bits in the clock embedded data signal may be arranged based on one of various patterns, and the clock recoverer may include any number of DLLs corresponding to the clock embedded data signal.

Referring back to FIGS. 1 and 4, although not illustrated in FIGS. 4, 5, 6 and 7, in an exemplary embodiment, the clock signal CLK and the first image data DATTS may not be combined with each other, and may be separately provided to the data driver 400. In such an embodiment, where the clock signal CLK and the first image data DATTS are separated from each other, the clock recoverer 420 may be omitted, and the receiver 410 may provide the clock signal CLK and the first image data DATTS to the descrambler 440.

The LFSR 430 may generate a second random number RN2. The descrambler 440 may remove the scrambling from the first image data DATTS based on the second random number RN2 to generate image data DATT'. The image data DATT' may be substantially the same as the third input image data DATT in FIG. 2.

In an exemplary embodiment, where the LFSR 240 and the scrambler 250 in FIG. 2 are omitted, the LFSR 430 and the descrambler 440 may also be omitted. In such an embodiment, where the LFSR 430 and the descrambler 440 are omitted, the clock recoverer 420 may divide the clock embedded data signal into the clock signal CLK and the image data DATT' based on the clock training signal CTS.

In an alternative exemplary embodiment, although not illustrated in FIG. 4, all of the clock recoverer 420, the LFSR 430 and the descrambler 440 may be omitted.

The TMC decoder 450 may remove the TMC from the first image data DATTS (e.g., from the image data DATT')
to generate second image data DAT'. The second image data DAT' may be substantially the same as the second input image data DAT in FIG. 2.

The dithering adder 460 may restore the dithering, which was performed by the external device and is removed by the timing controller 200 of FIG. 2, based on the clock signal CLK and the second image data DAT' to generate third image data DATD'. The third image data DATD' may be substantially the same as the first input image data DATD in FIG. 2.

In some exemplary embodiments, the dithering adder 460 may convert n-bit first pixel data (e.g., RD1 in FIG. 6) in the second image data DAT' into n-bit second pixel data in the third image data DATD' based on a first clock bit (e.g., CLK11 in FIG. 6) in the clock signal CLK, where n is a natural number equal to or greater than two.

Referring to FIG. 8, in some exemplary embodiments, a dithering adder 460 may include n XOR gates and (n-1) AND gates. In one exemplary embodiment, for example, when the first pixel data in the second image data DAT' is 6-bit pixel data, the dithering adder 460 may include six XOR gates, e.g., first to sixth XOR gates 462a, 462b, 462c, 462d, 462e and 462f, and five AND gates, e.g., first to fifth AND gates 464a, 464b, 464c, 464d and 464e.

The dithering adder 460 may convert first pixel data RD1 in the second image data DAT' into second pixel data RD1D in the third image data DATD'. In one exemplary embodiment, for example, the first XOR gate 462a may perform the XOR operation on the first clock bit CLK11 and a first bit R10 of the first pixel data RD1 to generate a first bit R10D of the second pixel data RD1D. The first AND gate 464a may perform an AND operation on the first clock bit CLK11 and the first bit R10 of the first pixel data RD1 that are input to the first XOR gate 462a. The second XOR gate 462b may perform the XOR operation on an output of the first AND gate 464a and a second bit R11 of the first pixel data RD1 to generate a second bit R11D of the second pixel data RD1D.

In such an embodiment, the second AND gate 464b may perform the AND operation on the output of the first AND gate 464a and the second bit R11 of the first pixel data RD1 that are input to the second XOR gate 462b. The third XOR gate 462c may perform the XOR operation on an output of the second AND gate 464b and a third bit R12 of the first pixel data RD1 to generate a third bit R12D of the second pixel data RD1D. The third AND gate 464c may perform the AND operation on the output of the second AND gate 464b and the third bit R12 of the first pixel data RD1 that are input to the third XOR gate 462c. The fourth XOR gate 462d may perform the XOR operation on an output of the third AND gate 464c and a fourth bit R13 of the first pixel data RD1 to generate a fourth bit R13D of the second pixel data RD1D. The fourth AND gate 464d may perform the AND operation on the output of the third AND gate 464c and the fourth bit R13 of the first pixel data RD1 that are input to the fourth XOR gate 462d. The fifth XOR gate 462e may perform the XOR operation on an output of the fourth AND gate 464d and a fifth bit R14 of the first pixel data RD1 to generate a fifth bit R14D of the second pixel data RD1D. The fifth AND gate 464e may perform the AND operation on the output of the fourth AND gate 464d and the fifth bit R14 of the first pixel data RD1 that are input to the fifth XOR gate 462e. The sixth XOR gate 462f may perform the XOR operation on an output of the fifth AND gate 464e and a sixth bit R15 of the first pixel data RD1 to generate a sixth bit R15D of the second pixel data RD1D.

In some exemplary embodiments, when the first clock bit CLK11 has the first logic level (e.g., the logic low level), the first pixel data RD1 may be substantially the same as the second pixel data RD1D. When the first pixel data RD1 is substantially the same as the second pixel data RD1D, a pixel operating based on the second pixel data RD1D may be disposed in the regions "0" in the first dithering map DM1 of FIG. 3A and the regions "0" in the first inversion dithering map IDM1 of FIG. 3B.

In some exemplary embodiments, when the first clock bit CLK11 has the second logic level (e.g., the logic high level), the first pixel data RD1 may be different from the second pixel data RD1D. In one exemplary embodiment, for example, a grayscale of the second pixel data RD1D may be higher than a grayscale of the first pixel data RD1 by about 1 grayscale. When the first pixel data RD1 is different from the second pixel data RD1D, a pixel operating based on the second pixel data RD1D may be disposed in the regions "1" in the first dithering map DM1 of FIG. 3A and the regions "−1" in the first inversion dithering map IDM1 of FIG. 3B.

Although an operation and a configuration of the dithering adder 460 is described based on an exemplary embodiment where the second image data DAT' includes 6-bit pixel data, the dithering adder 460 may include any number of the XOR gates and the AND gates, or may have one of various configuration for restoring the dithering.

Referring back to FIGS. 1 and 4, the voltage generator 470 may generate a plurality of data voltages VD based on the third image data DATD'. The voltage generator 470 may include a latch 472, a digital-to-analog converter 474 and a buffer 476.

The latch 472 may store the third image data DATD'. In one exemplary embodiment, for example, the latch 472 may store the third image data DATD' that is received in a serial form, and may output parallel third image data DATD". The digital-to-analog converter 474 may convert (e.g., may perform a digital-to-analog conversion) the third image data DATD" into the plurality of data voltages VD. The buffer 476 may output the plurality of data voltages VD to the display panel 100.

In an exemplary embodiment, the data driver 400 may restore the dithering, which is removed by the timing controller 200, based on the dithering adder 460. Accordingly, the data driver 400 may not include a storage that stores dithering maps, and may restore the dithering with a relatively simple structure.

In exemplary embodiments of the display apparatus 10 including the data driver 400, the timing controller 200 may remove the dithering from image data, and may perform the TMC on the image data. The data driver 400 may remove the TMC from image data received from the timing controller 200, and may restore the dithering on the image data. The display apparatus 10 may perform the TMC on dithered data, and the dithered data may be internally transmitted (e.g., transmitted from the timing controller 200 to the data driver 400) without damage in the dithered data and/or degradation of an image. Accordingly, the WWAN noise may be efficiently reduced in the display apparatus 10.

Figure 9:
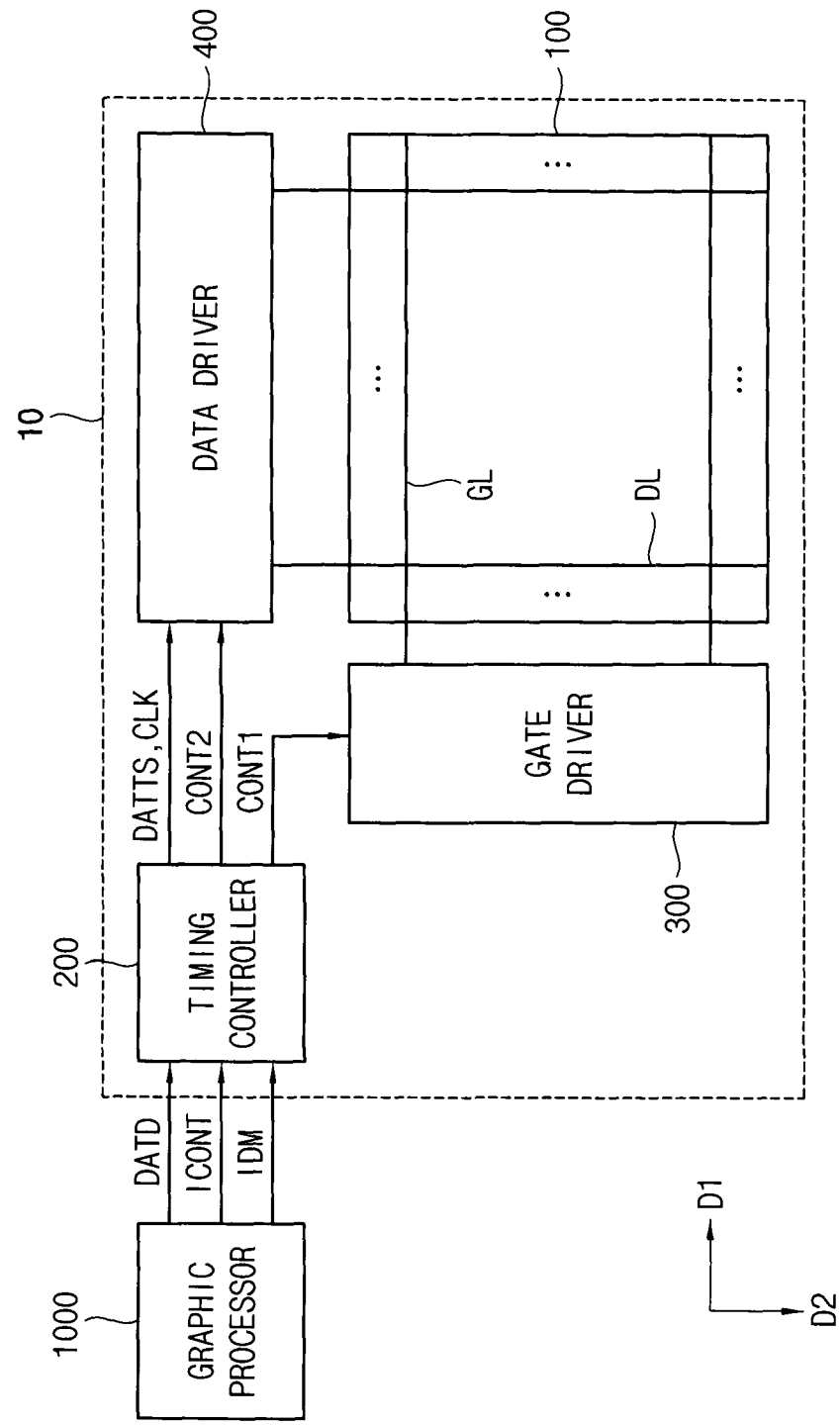
FIG. 9 is a block diagram illustrating a display apparatus according to an alternative exemplary embodiment.

FIG. 9 is a block diagram illustrating a display apparatus according to alternative exemplary embodiments.

Referring to FIG. 9, an exemplary embodiment of a display apparatus 10 may receive the first input image data DATD, the input control signal ICONT and the inversion dithering maps IDM from an external graphic processor 1000. The graphic processor 1000 may perform the dithering on original image data to generate the first input image data DATD. The inversion dithering maps IDM may be used to remove the dithering from the first input image data DATD. In one exemplary embodiment, for example, the inversion dithering maps IDM may be provided with the first input image data DATD. Alternatively, the inversion dithering maps IDM may be already provided to the display apparatus 10, and may be stored in the display apparatus 10.

The display apparatus 10 in FIG. 9 may be substantially the same as the display apparatus 10 of FIG. 1. The display apparatus 10 may include the display panel 100, the timing controller 200, the gate driver 300 and the data driver 400. The timing controller 200 may include a dithering inverter (e.g., the dithering inverter 220 in FIG. 2) that removes the dithering, and a TMC encoder (e.g., the TMC encoder 230 in FIG. 2) that performs the TMC. The data driver 400 may include a TMC decoder (e.g., the TMC decoder 450 in FIG. 4) that removes the TMC, and a dithering adder (e.g., the dithering adder 460 in FIG. 4) that restores the dithering without dithering maps.

Although the exemplary embodiments are described based on the dithering map DM1 of FIG. 3A, the inversion dithering map IDM1 of FIG. 3B, the clock embedded data signal CEDS in FIG. 6, and the dithering adder 460 of FIG. 8, the exemplary embodiments may employ a data driver and a display apparatus, each of which has at least one of various structures and operates based on at least one of various driving schemes.

The above described embodiments may be used in a display apparatus and/or a system including the display apparatus, such as a mobile phone, a smart phone, a personal digital assistant ("PDA"), a portable multimedia player ("PMP"), a digital camera, a digital television, a set-top box, a music player, a portable game console, a navigation device, a personal computer ("PC"), a server computer, a workstation, a tablet computer, a laptop computer, a smart card and a printer, for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A data driver comprising:
   a receiver which receives a clock signal and first image data, wherein the first image data is generated by removing a dithering from a dithered original image data and performing a transition minimization coding thereon;
   a transition minimization coding decoder which removes the transition minimization coding from the first image data to generate second image data;
   a dithering adder which restores the removed dithering based on the clock signal and the second image data to generate third image data; and
   a voltage generator which generates a plurality of data voltages based on the third image data.

2. The data driver of claim 1, wherein
the clock signal and the first image data are combined to form a clock embedded data signal,
the receiver receives the clock embedded data signal, and
the data driver further comprises a clock recoverer which divides the clock embedded data signal into the clock signal and the first image data.

3. The data driver of claim 2, wherein the clock recoverer comprises:
a clock detector which sets a clock window based on a clock training signal and detects the clock signal from the clock embedded data signal based on the clock window; and
an image data detector which delays the clock embedded data signal based on the clock signal to detect the first image data.

4. The data driver of claim 3, wherein
the clock signal includes a first clock bit and a second clock bit, and
the first clock bit has a logic level different from a logic level of the second clock bit.

5. The data driver of claim 4, wherein the clock detector determines a transition edge between the first clock bit and the second clock bit based on the clock window to detect the clock signal.

6. The data driver of claim 1, wherein
the dithering adder converts n-bit first pixel data in the second image data into n-bit second pixel data in the third image data based on a first clock bit in the clock signal,
wherein n is a natural number equal to or greater than two.

7. The data driver of claim 6, wherein
the dithering adder comprises n XOR gates and (n−1) AND gates,
wherein
a first XOR gate of the n XOR gates performs an XOR operation on the first clock bit and a first bit of the first pixel data to generate a first bit of the second pixel data,
a first AND gate of the (n−1) AND gates performs an AND operation on the first clock bit and the first bit of the first pixel data, and
a second XOR gate of the n XOR gates performs the XOR operation on an output of the first AND gate and a second bit of the first pixel data to generate a second bit of the second pixel data.

8. The data driver of claim 6, wherein
when the first clock bit has a first logic level, the first pixel data is substantially the same as the second pixel data, and
when the first clock bit has a second logic level, the first pixel data is different from the second pixel data.

9. The data driver of claim 1, wherein
a scrambling is performed on the first image data, and
the data driver further comprises:
a linear feedback shift register which generates a random number; and
a descrambler which removes the scrambling from the first image data based on the random number.

10. The data driver of claim 1, wherein the voltage generator comprises:
a latch which stores the third image data;
a digital-to-analog converter which converts the third image data into the plurality of data voltages; and
a buffer which outputs the plurality of data voltages.

11. A display apparatus comprising:
a timing controller which receives first input image data, which is generated by performing a dithering on original image data, and outputs a clock signal and first image data, wherein the timing controller generates the first image data by removing the dithering from the first input image data and performing a transition minimization coding on the first input image data;
a data driver which receives the clock signal and the first image data, wherein the data driver removes the transition minimization coding from the first image data, restores the removed dithering based on the clock signal, and generates a plurality of data voltages based on image data generated by removing the transition minimization coding and restoring the removed dithering; and
a display panel which displays an image based on the plurality of data voltages.

12. The display apparatus of claim 11, wherein the timing controller comprises:
a receiver which receives the first input image data;
a dithering inverter which removes the dithering from the first input image data based on a plurality of inversion dithering maps to generate second input image data;
a transition minimization coding encoder which performs the transition minimization coding on the second input image data to generate the first image data; and
a transmitter which outputs the clock signal and the first image data.

13. The display apparatus of claim 12, wherein the timing controller further comprises:
a linear feedback shift register which generates a random number; and
a scrambler which performs a scrambling on an output of the transition minimization coding encoder based on the random number.

14. The display apparatus of claim 11, wherein the data driver comprises:
a receiver which receives the clock signal and the first image data;
a transition minimization coding decoder which removes the transition minimization coding from the first image data to generate second image data;
a dithering adder which restores the dithering based on the clock signal and the second image data to generate third image data; and
a voltage generator which generates the plurality of data voltages based on the third image data.

15. The display apparatus of claim 14, wherein
the clock signal and the first image data are combined to form a clock embedded data signal,
the receiver receives the clock embedded data signal, and
the data driver further comprises a clock recoverer which divides the clock embedded data signal into the clock signal and the first image data.

16. The display apparatus of claim 15, wherein the clock recoverer comprises:
a clock detector which sets a clock window based on a clock training signal and detects the clock signal from the clock embedded data signal based on the clock window; and
an image data detector which delays the clock embedded data signal based on the clock signal to detect the first image data.

17. The display apparatus of claim 16, wherein
the clock signal includes a first clock bit and a second clock bit, and
the first clock bit has a logic level different from a logic level of the second clock bit.

18. The display apparatus of claim 17, wherein the clock detector determines a transition edge between the first clock bit and the second clock bit based on the clock window to detect the clock signal.

19. The display apparatus of claim 14, wherein
the dithering adder converts n-bit first pixel data in the second image data into n-bit second pixel data in the third image data based on a first clock bit in the clock signal,
wherein n is a natural number equal to or greater than two.

20. The display apparatus of claim 19, wherein
the dithering adder comprises n XOR gates and (n−1) AND gates,
wherein
a first XOR gate of the n XOR gates performs an XOR operation on the first clock bit and a first bit of the first pixel data to generate a first bit of the second pixel data,
a first AND gate of the (n−1) AND gates performs an AND operation on the first clock bit and the first bit of the first pixel data, and
a second XOR gate of the n XOR gates performs the XOR operation on an output of the first AND gate and a second bit of the first pixel data to generate a second bit of the second pixel data.

* * * * *